(12) United States Patent  
Okunuki

(10) Patent No.: US 7,039,084 B2
(45) Date of Patent: May 2, 2006

(54) SEMICONDUCTOR LASER AND ELEMENT FOR OPTICAL COMMUNICATION

(75) Inventor: Yuichiro Okunuki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 289 days.

(21) Appl. No.: 10/386,553

(22) Filed: Mar. 13, 2003

(65) Prior Publication Data

US 2004/0076206 A1 Apr. 22, 2004

(30) Foreign Application Priority Data

Oct. 17, 2002 (JP) ............................. 2002-302711

(51) Int. Cl.
*H01S 5/00* (2006.01)
(52) U.S. Cl. .............................. 372/46.01; 372/43.01; 372/46.016
(58) Field of Classification Search .................. 372/43, 372/44, 45, 50, 43.01, 45.01, 46.01, 46.016, 372/49.01
See application file for complete search history.

(56) References Cited

U.S. PATENT DOCUMENTS

| | | | | | |
|---|---|---|---|---|---|
| 5,020,067 | A | * | 5/1991 | Okada | 372/46.01 |
| 5,442,649 | A | * | 8/1995 | Kokubo et al. | 372/46.014 |
| 5,539,759 | A | * | 7/1996 | Chang-Hasnain et al. | 372/19 |
| 5,556,804 | A | * | 9/1996 | Nagai | 438/5 |
| 5,577,063 | A | * | 11/1996 | Nagai et al. | 372/46.016 |
| 5,737,351 | A | * | 4/1998 | Ono | 372/46.015 |
| 6,272,161 | B1 | | 8/2001 | Petrescu-Prahova | |
| 6,385,225 | B1 | | 5/2002 | Fukagai | |
| 6,455,338 | B1 | * | 9/2002 | Takagi et al. | 438/24 |
| 2002/0075923 | A1 | * | 6/2002 | Tashiro et al. | 372/45 |
| 2003/0062528 | A1 | * | 4/2003 | Yoshida et al. | 257/79 |

OTHER PUBLICATIONS

Utaka, K. et al.; "Effect of Mirror Facets on Lasing Characteristics of Distributed Feedback InGaAsP/InP Laser Diodes at 1.5 µm Range", *IEEE J. of Quantum Electronics*, vol. QE-20, No. 3, pp. 236-245, (Mar. 1984).

\* cited by examiner

*Primary Examiner*—Minsun Oh Harvey
*Assistant Examiner*—Phillip Nguyen
(74) *Attorney, Agent, or Firm*—Leydig, Voit & Mayer, Ltd.

(57) ABSTRACT

A semiconductor laser with a window structure which can emit a light beam with a non-deviated outgoing angle. The semiconductor laser emits a light beam generated at an active layer via a window section. The window section includes a first semiconductor layer having a first carrier concentration and a second semiconductor layer on the first semiconductor layer as an extension of the active layer and which has a second carrier concentration lower than the first carrier concentration. The window section further includes a third semiconductor layer having a third carrier concentration. According to the third layer, a refractive index distribution of the light beam at the window section is symmetrical in the laminating direction, with the extension of the active layer as a center. Because the beam is uniformly propagated, the beam can be emitted without being deviated in the laminating direction.

10 Claims, 3 Drawing Sheets

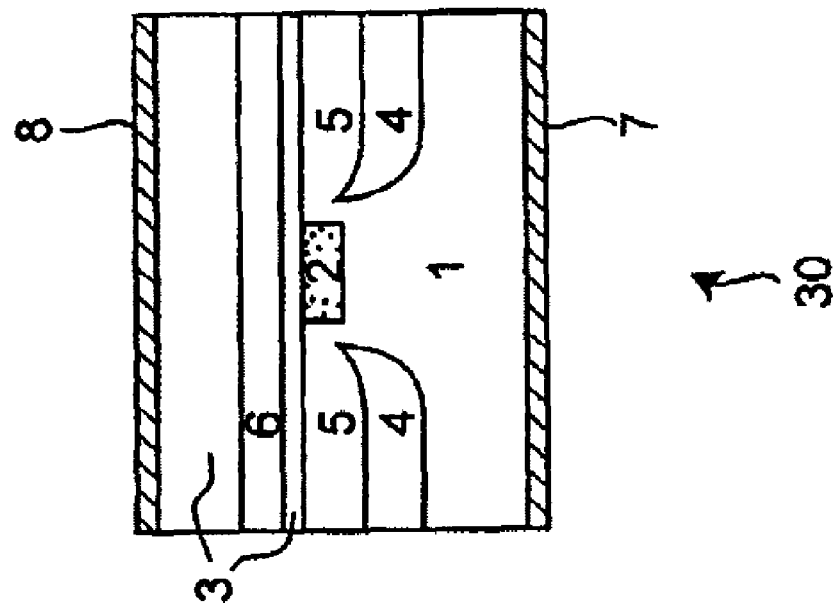
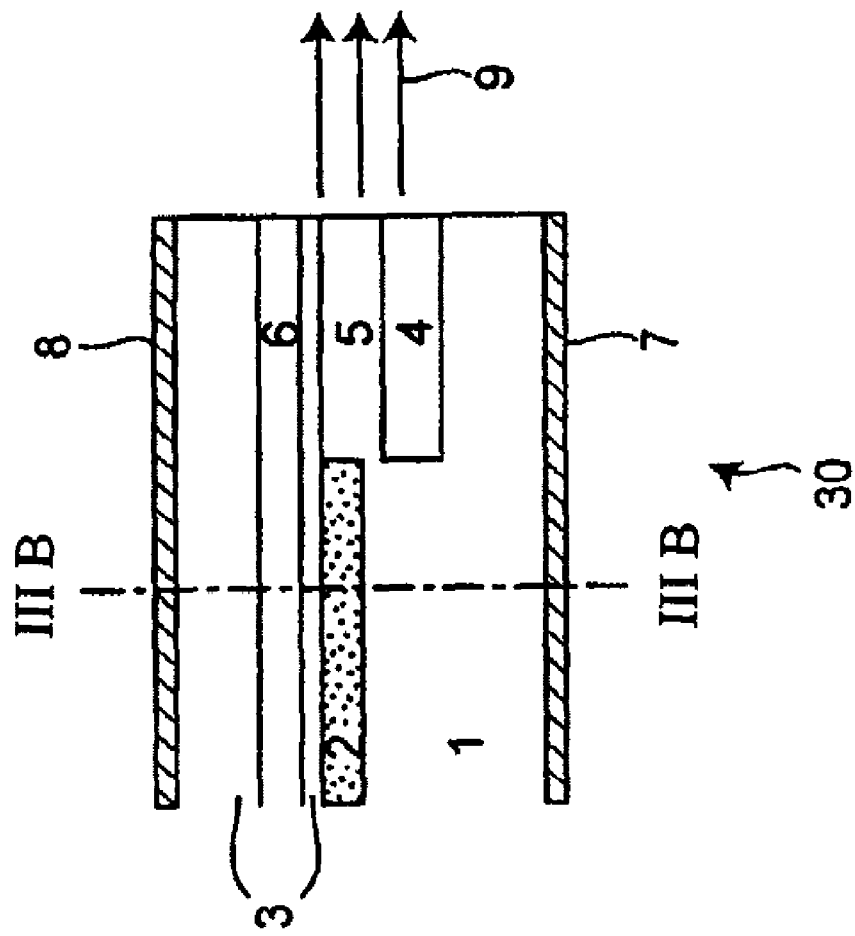

SEMICONDUCTOR LASER AND ELEMENT FOR OPTICAL COMMUNICATION

BACKGROUND OF THE INVENTION

1. Field of the Invention

The present invention relates to a semiconductor laser, and an optical element with a semiconductor laser and other optical elements integrated.

2. Description of the Background Art

An emission end facet of a semiconductor laser is generally formed by cleavage, except for specific laser devices such as vertical cavity surface emitting laser devices. After cleavage, high-reflective coating, low-reflective coating, non-reflective coating, or other coatings are applied to the emission end facet, according to applications for the semiconductor laser.

There exist semiconductor laser devices which cause problems when a part of laser beam reflected at the end facet, where the laser beam emerges, returns to an active layer of the semiconductor laser device. For example, one of such laser devices is a distribution feedback laser diode (DFB-LD) which is used for optical communications, especially, laser devices called λ/4 shift DFB-LD. In this kind of laser device, a non-reflective coating is applied to the end facet. This non-reflective coating ideally means to provide a coating film with zero (0) reflectance. Although it is desirable that the reflectance should be zero, it is impossible for the reflectance to be completely zero due to variations of fabrication accuracy of the coating film, for example. Consequently, even when a non-reflective coating is provided, part of the laser beam is reflected at the end facet, in actuality.

In laser devices which require non-reflective emission end facets, a so-called window structure is frequently adopted (with respect to a principle of the window structure, see IEEE Journal of Quantum Electronics, Vol. QE-20, No. 3, pp. 236–245 (1984)). This is because, with to the window structure, a returning reflected light from the end facet can be prevented from entering into the active layer of the semiconductor laser device.

The reason why the returning reflected light can be prevented from entering into the active layer by adopting the window structure can be described as follows. Since no waveguide structure exists in a window structure section, the light entering into the window section from the active layer gradually expands and propagates. As a result, at the end facet of the laser device, a distribution of a light intensity is held expanded. Part of the light that has reached the end facet is slightly reflected even when non-reflective coating is provided. However, since the distribution of the light intensity is expanded, considerable part of the reflected light does not return to the active layer. Consequently, the reflectance can be effectively lowered by providing the window structure.

In addition, because the window structure effectively lowers the reflectance of the end facet as is the case of DFB-LD, it is also used for elements with a modulator and a laser device integrated. The window structure is further adopted for high power laser devices. In the high power laser devices, temperature rise easily occurs locally when light density is high at the end facet, and the end facet section suffers damage due to the heat and which degrades the laser device. To prevent the degradation, the window structure which gradually expands the light and lowers the light density at the end facet becomes effective.

In a conventional window structure, returning reflected light and light density can be lowered, whereas it has a problem that the outgoing beam angle is likely to deviate in the vertical direction (that is, direction perpendicular to the outgoing beam direction). The reasons are described as follows.

Semiconductor laser devices are essentially likely to have an asymmetric structure with respect to the laminating direction with the active layer set as a center. This is because the semiconductor laser devices are diodes and include p-type semiconductor and n-type semiconductor. In general, when the lower side of the active layer is p-type, the upper side is n-type, and when the lower side is n-type, the upper side is p-type. Furthermore, there are cases in which current constriction structure for concentrating current to the active layer with 1 to 2-μm-width is installed on one side of the active layer, constituting one cause of asymmetry.

In semiconductor laser devices in which InP-based and GaAs-based materials are used, not only conductivity type but also distribution of carrier concentration are likely to cause an asymmetry in vertical direction. This is because it is difficult to increase p-type carrier concentration in fabricating elements. When a difference in the carrier concentration occurs, a refractive index of the material varies due to a phenomenon called the plasma effect. As a result, the refractive index in the elements becomes asymmetrical in the vertical direction. The window section is no exception and the refractive index in the laminating direction is vertically asymmetrical with an extension of the active layer set as a center.

In semiconductor laser devices made of materials with an asymmetrical refractive index arising from the distribution of the carrier concentration, a phenomenon is observed in which an outgoing angle of the light is deviated in a perpendicular direction (laminating direction). This is because the light propagates while avoiding the area with low refractive index.

Now, a specific example where the light outgoing angle is deviated is described. In conventional laser devices, right below the optical axis of the window section (an extension of the active layer), an n-type InP layer with a high carrier concentration exists. The carrier concentration is kept high because the n-type InP layer works as a current blocking layer and the high-temperature and high-output characteristics are degraded when the carrier concentration is low. As a result, the refractive index of n-type InP layer of high carrier concentration is about 0.6% lower than that of p-type InP layer or n-type InP layer located above due to changes of the refractive index caused by the above-described plasma effect. Consequently, the outgoing light is bent upwards as it propagates in the window section, and goes out from the end facet upwards at angles of about 5 to 10°.

If the angle of the outgoing light deviates, for example, when laser outgoing light is coupled with optical fiber, problems occur such as lowered combination efficiency.

SUMMARY OF THE INVENTION

It is an object of the present invention to provide a semiconductor optical element with a window structure which can emit light without deviating an outgoing angle.

An semiconductor laser according to the present invention emits a light beam generated at an active layer via a window section. The window section includes a first semiconductor layer having a first carrier concentration and a second semiconductor layer which is formed on the first semiconductor layer to include an extension of the active layer and which has a second carrier concentration lower than the first carrier concentration. The window section further includes a third semiconductor layer having a third carrier concentration. Because at the window section, the distribution of the refractive index is made equal in the laminating direction with the extended surface (optical axis) set as the center, the generated light is equally propagated. Thus, the light beam can be emitted without being deviated in the vertical direction (laminating direction).

It is possible to obtain an optical communications element by integrating this kind of semiconductor laser with an optical modulator.

BRIEF DESCRIPTION OF THE DRAWINGS

This and other objects and features of the present invention will become clear from the subsequent description of a preferred embodiments thereof made with reference to the accompanying drawings, in which like parts are designated by like reference numerals and in which:

FIG. 3A is a cross-sectional view of a semiconductor laser device according to embodiment 2; and FIG. 3B is a cross-sectional view of the semiconductor laser taken on line IIIB—IIIB of FIG. 3A.

DETAILED DESCRIPTION OF THE PREFERRED EMBODIMENTS

Embodiments of the present invention will be described below with reference to the accompanying drawings.

Embodiment 1

Figure 1B:
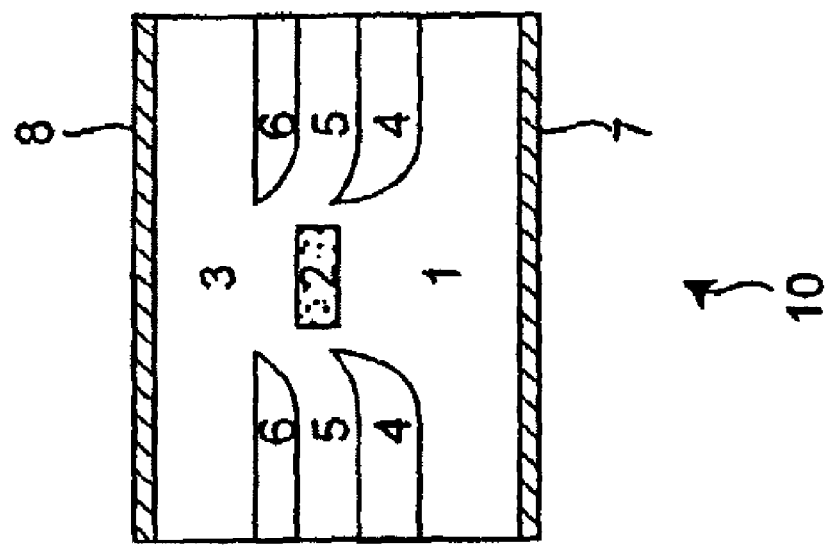
FIG. 1B is a cross-sectional view of the semiconductor laser device taken on line IB—IB of FIG. 1A.
Figure 1A:
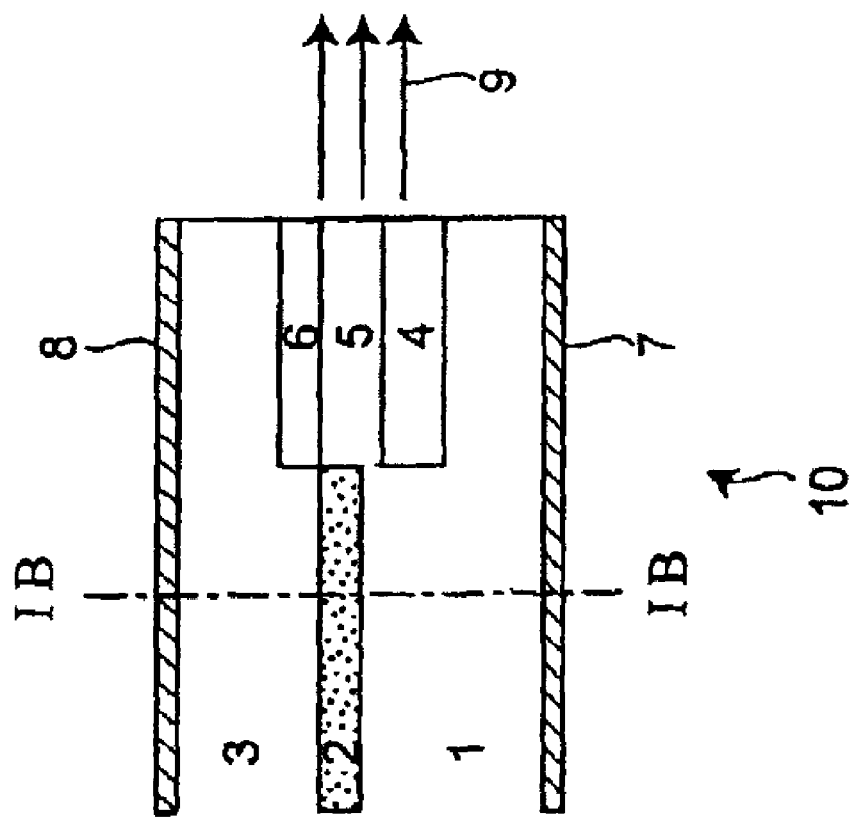
FIG. 1A is a cross-sectional view of a semiconductor laser device according to embodiment 1.

FIG. 1A is a cross-sectional view of a semiconductor laser 10 according to embodiment 1, and FIG. 1B is a cross-sectional view of semiconductor laser 10 taken on line IB—IB of FIG. 1A. Semiconductor laser 10 according to the present embodiment has a window section at an end facet where light emerges. The "window section" referred to herein is an area located between electrode 7 and electrode 8, which has a width from an end facet of an InGaAsP active layer 2 to the emission end facet of semiconductor laser 10. With the window section provided, a light beam generated in InGaAsP active layer 2 passes the window section after it comes out from layer 2 and is emitted outside of semiconductor laser 10.

Semiconductor laser 10 includes a p-type InP substrate 1, an InGaAsP active layer 2, an n-type InP clad layer 3, an n-type InP current block layer 4, a p-type InP current block layer 5, an n-type InP refractive index adjusting layer 6, and electrodes 7 and 8. In semiconductor laser 10, positive hole and electron injected from electrodes 7 and 8 combine at InGaAsP active layer 2 and output the light beam. Although the light beams are radiated in all directions, only the light beam parallel to InGaAsP active layer 2 is taken out. The light beam is emitted to the outside through the window section.

Embodiment 1 is characterized in that the n-type InP refractive index adjusting layer 6 whose carrier concentration is adjusted, is provided to make it equal a distribution of the refractive index of optical axis at the window section. Because a distribution of the refractive index in the laminating direction becomes symmetrical with an extension of active layer 2 set as a center, the generated light propagates uniformly and is emitted without deviating in the vertical direction, that is, laminating direction.

Now, a process for forming semiconductor laser 10 is described as follows. Semiconductor laser 10 of a structure shown in FIGS. 1A and 1B can be formed by laminating each layer by adopting an epitaxial growth method and by etching to eliminate specified part of the layer(s). For the epitaxial growth method, for example, a metal organic vapor phase epitaxy (MOVPE) in which gas containing organic metal to be grown is allowed to flow towards a substrate and the metal is grown by chemical reactions on the substrate surface, or a metalorganic molecular beam epitaxy (MO-MBE) in which organic metal is evaporated towards a substrate in high vacuum and is grown by allowing it to adhere to the substrate.

Discussion will be made on a specific laminating procedure utilizing the MOVPE. Firstly, on p-type InP substrate 1, InGaAsP active layer 2 is laminated. Then, etching is carried out to remove part of InGaAsP active layer 2. Etching is carried out to the bottom of the layer shown by reference character 4. Thereafter, n-type InP current block layer 4, p-type InP current block layer 5, n-type InP refractive index adjusting layer 6, and n-type InP clad layer 3 are successively laminated. Finally, electrodes 7 and 8 are formed.

In the present embodiment, a carrier concentration of p-type InP substrate 1 is, for example, $5 \times 10^{18}/cm^3$ (hereinafter expressed as "$cm^{-3}$"), then, carrier concentrations of other layers are $1 \times 10^{18}$ $cm^{-3}$ for n-type InP clad layer 3, $8 \times 10^{18}$ $cm^{-3}$ for n-type InP current block layer 4, $1 \times 10^{18}$ $cm^{-3}$ for p-type InP current block layer 5, and $8 \times 10^{18}$ $cm^{-3}$ for n-type InP refractive index adjusting layer 6. The n-type InP current block layer 4 is installed to concentrate current to InGaAsP active layer 2. The reason why the carrier concentration of n-type InP current block layer 4 is high is to obtain good high-temperature high-output characteristics.

Figure 2:
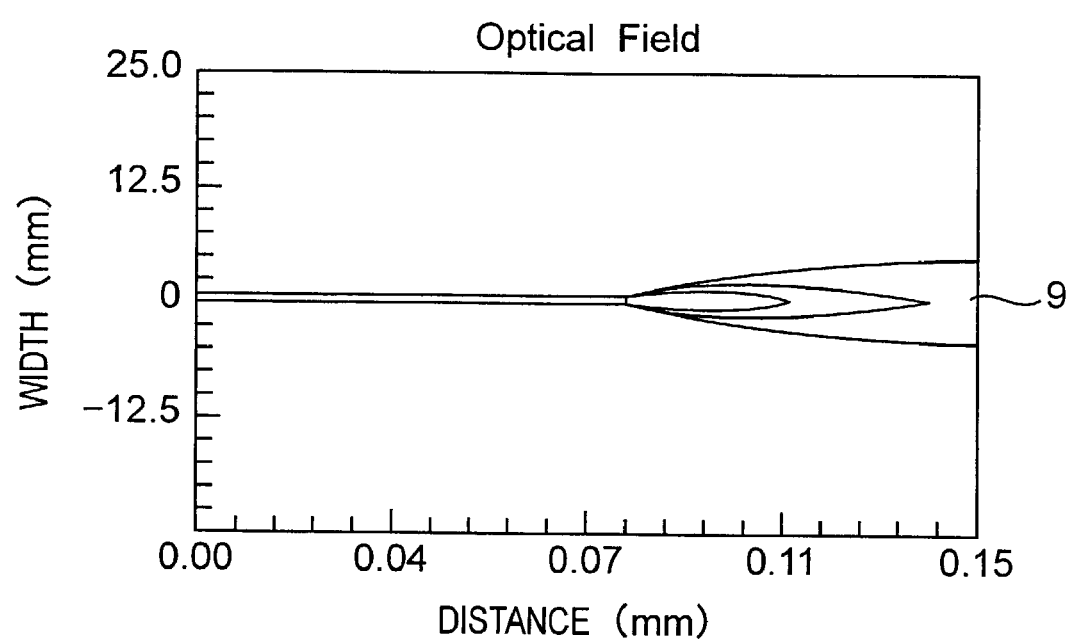
FIG. 2 is a drawing which shows a result of calculating a propagating condition of light generated by the semiconductor laser device by BPM.

In semiconductor laser 10, n-type InP current block layer 4 with high carrier concentration exists right below the optical axis of the window section, whereas right above the optical axis, n-type InP refractive index adjusting layer 6 with the same concentration is installed. Consequently, a distribution of the refractive index at the window section becomes nearly symmetrical in the laminating direction (vertically) with an extension of active layer 2 set as a center. As a result, the generated light is uniformly propagated and is emitted without deviating in the laminating direction. FIG. 2 shows BPM calculation results of a propagating condition of the generated light by semiconductor laser 10. As clear from the figure, the light emitting direction is, in actuality, horizontal and no angle deviation of light emission exists.

Embodiment 2

In embodiment 2, a semiconductor laser with n-type InP refractive index adjusting layer 6 laminated throughout a whole resonator will be discussed.

FIG. 3A is a cross-sectional view of semiconductor laser 30 according to embodiment 2, and FIG. 3B is a cross-sectional view of semiconductor laser 30 taken on line IIIB—IIIB of FIG. 3A. Semiconductor laser 30 according to the present embodiment also has a window structure as is the case of embodiment 1.

The layer structure of semiconductor laser 30 is the same as semiconductor laser 10 (FIG. 1) except for a location and a range of n-type InP refractive index adjusting layer. In the remainder of this section, discussion will be primarily made on n-type InP refractive index adjusting layer 6. Concentration of each layer is the same as in embodiment 1.

The n-type InP refractive index adjusting layer 6 is formed in such a manner that the layer is inserted in the layer of n-type InP clad layer 3. That is, n-type InP refractive index adjusting layer 6 is installed on n-type InP clad layer 3 laminated on InGaAsP active layer 2 and p-type InP current block layer 5. On the top of n-type InP refractive index adjusting layer 6, n-type InP clad layer 3 is laminated again. This kind of structure can be obtained, after laminating p-type InP current block layer 5, by laminating n-type InP clad layer 3, n-type InP refractive index adjusting layer 6, and n-type InP clad layer 3 again. By configuring in this way, the refractivity distribution at the window section can be made nearly symmetric in the laminating direction with an extension of active layer 2 set as a center. Consequently, the angle of emitting light 9 is not deviated.

However, since a high-carrier concentration layer (refractivity adjustment layer 6) exists throughout the whole resonator, a threshold current of the laser increases due to absorption of free carriers, resulting in lowered efficiency. Consequently, the whole n-type InP clad layer 3 should not be designated as a high carrier concentration layer but n-type InP clad layer 3 shall be formed with refractivity adjusting layer 6 inserted in part of n-type InP clad layer 3 in order to suppress influence of free carrier absorption to the minimum.

Now, embodiments 1 and 2 have been described. In these embodiments, the carrier concentration of n-type InP block layer 4 is set to $8 \times 10^{18}$ cm$^{-3}$ for an example. However, for objectives to improve high-temperature characteristics, cases in which the carrier concentration of n-type InP block layer 4 is increased to, for example, about $2 \times 10^{19}$ cm$^{-3}$ may be assumed. In this case, an average refractive index in the vicinity of the optical axis at the window section must be increased. The reason is that, since the average refractive index in the vicinity of the optical axis at the window section becomes about 2% lower than the surrounding InP, when the invention recited in embodiment 1 or 2 is applied, the average refractive index in the vicinity of the optical axis at the window section becomes comparatively lower than the surrounding clad layer 3 and, contra-waveguide action works on and the light is separated in top and bottom two directions and is propagated. Consequently, it is effective to change p-type InP block layer 5 (FIGS. 1A, 1B, 3A and 3B) to p-type InGaAsP. However, in order to obtain satisfactory high-temperature and high-output characteristics, the InGaAsP composition is recommended to be as close to the composition of InP as possible (for example, the composition that achieves 1.2 eV or higher band gap). Thus, even when the carrier concentration of n-type InP block layer is extremely high, semiconductor laser free of deviation of light emitting angle can be obtained.

In the description of embodiments 1 and 2 up to now, description is made with the conductivity type of each layer specified. However, this is merely an example and the present invention can be applied without being limited by these.

The present invention can be applied to any laser in the case the laser has one of structures shown in FIGS. 1A and 1B, and FIGS. 3A and 3B. One example is a distribution feedback laser (diode) (DFB laser) device which has a diffraction grating. The DFB laser device has a reflecting surface which is constructed by the diffraction grating in a resonator. It is possible to output a light beam with specific wavelength by carrying out single-mode oscillation by the diffraction grating. This is useful for ultra high-speed, long-distance optical communications because specific wavelength can be obtained. In addition, the present invention can be applied to $\lambda/4$ shift DFB laser device for another example, which is one of the laser devices for unifying longitudinal mode of semiconductor laser, and by deviating the phase of diffraction grating by $\pi$ at the center, only a minimum-order mode that satisfies Bragg conditions is resonated to obtain a single mode. The present invention can also be applied to high-power laser devices. Because of the window structure of the present invention, the light density can be reduced and at the same time, the light can be emitted without tilting the optical axis.

In the above embodiments, laser devices including InP-based materials has been discussed, but the invention can be applied to laser devices using other materials including GaAs, for example.

Semiconductor laser devices according to the present invention is useful in optical communications. In the optical communications, lights must be modulated to superimpose signals. For optical modulation, direct modulation in which a driving power of semiconductor laser is modulated, and external modulation in which the light from semiconductor laser by means other than light source is modulated, is known. A modulator used for external modulation is generally called an optical modulator. The optical modulator gives rise to physical changes in the modulator according to signals and modulates light intensity, phase, etc. Even if elements for optical communications are formed by monolithically integrating the semiconductor laser according to the present invention with this kind of optical modulator, advantages of the present invention will remain as they are. That is, since the application of the semiconductor laser according to the present invention can prevent deviation of optical axis, optical communications free of reduced combination efficiency to optical fiber can be achieved.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser comprising:
   a substrate;
   a plurality of layers laminated on the substrate, including an active layer in which a light beam is generated, the plurality of layers including end facets transverse to the plurality of layers, including the active layer, and to the substrate; and
   a window section contiguous to one of the end facets and through which the light is emitted, the window section comprising:
   a first semiconductor layer which has a first carrier concentration;
   a second semiconductor layer on the first semiconductor as an extension of the active layer and which has a second carrier concentration lower than the first carrier concentration; and
   a third semiconductor layer which has a third carrier concentration, on the second semiconductor layer, so that a distribution of refractive index of the light beam at the window section is symmetrical, in a laminating direction of the plurality of layers, about a center, with an extension of the active layer as the center.

2. The semiconductor laser according to claim 1, wherein the third carrier concentration is substantially equal to the first carrier concentration.

3. The semiconductor laser according to claim 2, wherein the third semiconductor layer is laminated on the second semiconductor layer.

4. The semiconductor laser according to claim 2, including a fourth semiconductor layer between the third semiconductor layer and the second semiconductor layer.

5. The semiconductor laser according to claim 2, wherein the third semiconductor layer extends over part of the active layer.

6. The semiconductor laser according to claim 2, wherein the substrate is p-type InP, and the first semiconductor layer and the third semiconductor layer are n-type InP.

7. The semiconductor laser according to claim 6, wherein the second semiconductor layer is InGaAsP.

8. An element for optical communications including:
an optical modulator; and
a semiconductor laser comprising:
   a substrate;
   a plurality of layers laminated on the substrate, including an active layer in which a light beam is generated, the plurality of layers including end facets transverse to the plurality of layers, including the active layer, and to the substrate; and
   a window section contiguous to one of the end facets and through which the light is emitted, the window section of the semiconductor laser comprising:
      a first semiconductor layer which has a first carrier concentration;
      a second semiconductor layer on the first semiconductor as an extension of the active layer and which has a second carrier concentration lower than the first carrier concentration; and
      a third semiconductor layer which has a third carrier concentration, on the second semiconductor layer, so that a distribution of reflective index of the light beam at the window section is symmetrical, in a laminating direction of the plurality of layers, about a center, with an extension of the active layer as the center.

9. The semiconductor laser according to claim 1, wherein the second semiconductor layer fills a volume that would be filled by the active layer if the active layer extended through the window section.

10. The element for optical communications according to claim 8, wherein the second semiconductor layer fills a volume that would be filled by the active layer if the active layer extended through the window section.

* * * * *